(12) United States Patent
Lee et al.

(10) Patent No.: US 8,753,905 B2
(45) Date of Patent: Jun. 17, 2014

(54) METHOD AND CARRIER SUBSTRATE FOR MANUFACTURING DISPLAY DEVICE

(71) Applicant: Samsung Display Co., Ltd., Yongin (KR)

(72) Inventors: Dong-Min Lee, Yongin (KR); Chang-Mo Park, Yongin (KR); Mu-Gyeom Kim, Yongin (KR); Young-Sik Yoon, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/749,909

(22) Filed: Jan. 25, 2013

(65) Prior Publication Data

US 2014/0051192 A1    Feb. 20, 2014

(30) Foreign Application Priority Data

Aug. 17, 2012 (KR) .................. 10-2012-0090097

(51) Int. Cl.
*H01L 21/00* (2006.01)
(52) U.S. Cl.
USPC ....... 438/26; 438/455; 438/458; 257/E21.001
(58) Field of Classification Search
USPC ........................................................ 438/458
See application file for complete search history.

(56) References Cited

U.S. PATENT DOCUMENTS

| | | | |
|---|---|---|---|
| 6,878,607 B2 | 4/2005 | Inoue et al. | |
| 7,285,476 B2 | 10/2007 | Shimoda et al. | |
| 2007/0091062 A1 | 4/2007 | French et al. | |
| 2009/0148682 A1 | 6/2009 | Higuchi | |
| 2011/0006314 A1* | 1/2011 | Yamazaki | 257/88 |
| 2011/0111194 A1 | 5/2011 | Carre et al. | |
| 2011/0294244 A1* | 12/2011 | Hattori et al. | 438/34 |
| 2012/0001534 A1 | 1/2012 | Kim | |
| 2013/0089954 A1* | 4/2013 | Ro et al. | 438/113 |

FOREIGN PATENT DOCUMENTS

| | | |
|---|---|---|
| KR | 10-2009-0037856 A | 4/2009 |
| KR | 10-2009-0102065 A | 9/2009 |
| KR | 10-2012-0003664 A | 1/2012 |
| KR | 10-2012-0023063 A | 3/2012 |

\* cited by examiner

*Primary Examiner* — Angel Roman
(74) *Attorney, Agent, or Firm* — Robert E. Bushnell, Esq.

(57) ABSTRACT

A method of manufacturing a display device, the method including forming a first layer on a rigid glass substrate, the first layer having a hydrophobic surface; forming a second layer to be bonded to a rigid thin glass substrate on the first layer to prepare a carrier substrate; bonding the rigid thin glass substrate onto the second layer; forming and encapsulating a display portion on an upper surface of the rigid thin glass substrate; and irradiating a laser beam to delaminate the first layer and detaching the rigid thin glass substrate from the rigid glass substrate.

15 Claims, 5 Drawing Sheets

METHOD AND CARRIER SUBSTRATE FOR MANUFACTURING DISPLAY DEVICE

CLAIM OF PRIORITY

This application makes reference to, incorporates the same herein, and claims all benefits accruing under 35 U.S.C. §119 from an application for METHOD AND CARRIER SUBSTRATE FOR MANUFACTURING DISPLAY DEVICE earlier filed in the Korean Intellectual Property Office on Aug. 17, 2012 and there duly assigned Serial No. 10-2012-0090097.

BACKGROUND OF THE INVENTION

1. Field of the Invention

Embodiments of the present invention relate generally to a method of manufacturing a display device, and more particularly, to a method of manufacturing a display device by using a carrier substrate.

2. Description of the Related Art

Recently, traditional display devices have been replaced with portable thin flat panel display devices. Among the flat panel display devices, organic or inorganic light-emitting display devices are self-emissive display devices having wide viewing angles, excellent contrast ratios, and high response speeds, and thus, are regarded as next-generation display devices. In addition, an organic light-emitting display device, including an emission layer formed of an organic material, has excellent luminosity, driving voltage, and response speed characteristics compared to an inorganic light-emitting display device, and may realize a color image.

A thin flat panel display device is usually manufactured by using a rigid thin glass substrate. In this regard, the rigid thin glass substrate is very thin, and thus, is easily damaged when a single rigid thin glass substrate is used to manufacture a flat display device.

SUMMARY OF THE INVENTION

Embodiments of the present invention provide a method of manufacturing a display device, for easily detaching a completed display device from a carrier substrate. Embodiments of the present invention also relates to a carrier substrate for forming a display device.

According to an aspect of the present invention, there is provided a method of manufacturing a display device, the method including forming a first layer on a rigid glass substrate, the first layer having a hydrophobic surface; forming a second layer to be bonded to a rigid thin glass substrate on the first layer to prepare a carrier substrate; bonding the rigid thin glass substrate onto the second layer; forming and encapsulating a display portion on an upper surface of the rigid thin glass substrate; and irradiating a laser beam to delaminate the first layer and detaching the rigid thin glass substrate from the rigid glass substrate.

The forming and encapsulating of the display portion may include forming a thin film transistor (TFT) array on the upper surface of the rigid thin glass substrate, the second layer being cured such that the rigid thin glass substrate and the carrier substrate are adhered to each other; and forming and encapsulating an organic light-emitting device on the TFT array.

The second layer and the first layer may remain on a lower surface of the rigid thin glass substrate, and the method may further include removing a remaining portion of the first layer.

The laser beam may use a wavelength band of 250 nm to 350 nm and an energy density of 250 mJ/cm$^2$ to 350 mJ/cm$^2$.

The method may further include, prior to the bonding, washing the second layer.

The first layer may include polyimide.

The first layer may have a thickness of 10 nm to 10 μm.

The second layer may include at least one of silicon nitride (SiNx) and a transparent metal oxide.

The transparent metal oxide may include at least one of amorphous indium zinc oxide (a-IZO), titanium indium zinc oxide (TIZO), and indium gallium zinc oxide (GIZO).

The second layer may have a thickness of 30 nm to 70 nm.

According to another aspect of the present invention, there is provided a carrier substrate including a rigid substrate formed of glass; a first layer that is formed on the rigid substrate, has a hydrophobic surface, and is capable of being delaminated by irradiating a laser beam; and a second layer formed on the first layer and bonded onto a glass substrate.

The first layer may include polyimide.

The first layer may have a thickness of 10 nm to 10 μm.

The second layer may include at least one of silicon nitride (SiNx) and a transparent metal oxide.

The transparent metal oxide may include at least one of amorphous indium zinc oxide (a-IZO), titanium indium zinc oxide (TIZO), and indium gallium zinc oxide (GIZO).

The second layer may have a thickness of 30 nm to 70 nm.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

As the invention allows for various changes and numerous embodiments, embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

The terms such as "first" and "second" are used herein merely to describe a variety of constituent elements, but the constituent elements are not limited by the terms. The terms are used only for the purpose of distinguishing one constituent element from another constituent element.

It will be understood that when an element, layer or region is referred to as being "on" another element, layer or region, the element, layer or region can be directly on another element, layer or region or intervening elements, layers or regions.

Expressions such as "at least one of," when preceding a list of elements, modify the entire list of elements and do not modify the individual elements of the list.

The present invention will now be described more fully with reference to the accompanying drawings, in which exemplary embodiments of the invention are shown. In the drawings, the same elements are denoted by the same reference numerals, and a repeated explanation thereof will not be given. The thicknesses of layers and regions are enlarged for clarity. In addition, the thicknesses of some layers and regions are exaggerated for convenience of explanation.

A thin flat panel display device is often manufactured by using a rigid thin glass substrate. In this regard, the rigid thin glass substrate is very thin, and thus, is easily damaged when a single rigid thin glass substrate is used to manufacture a flat display device. Therefore, in order to prevent the damage of the rigid thin glass substrate during the manufacture of a flat display device, the rigid thin glass substrate is bonded to a carrier substrate. However, if the carrier substrate is formed of a similar glass material to that of the rigid thin glass substrate, a covalent bond is formed between the carrier substrate and the rigid thin glass substrate during a high-temperature manufacturing process. Thus, after the manufacturing processes of the flat display device have been completed, the carrier substrate is not easy to be detached from the rigid thin glass substrate.

Figure 1:
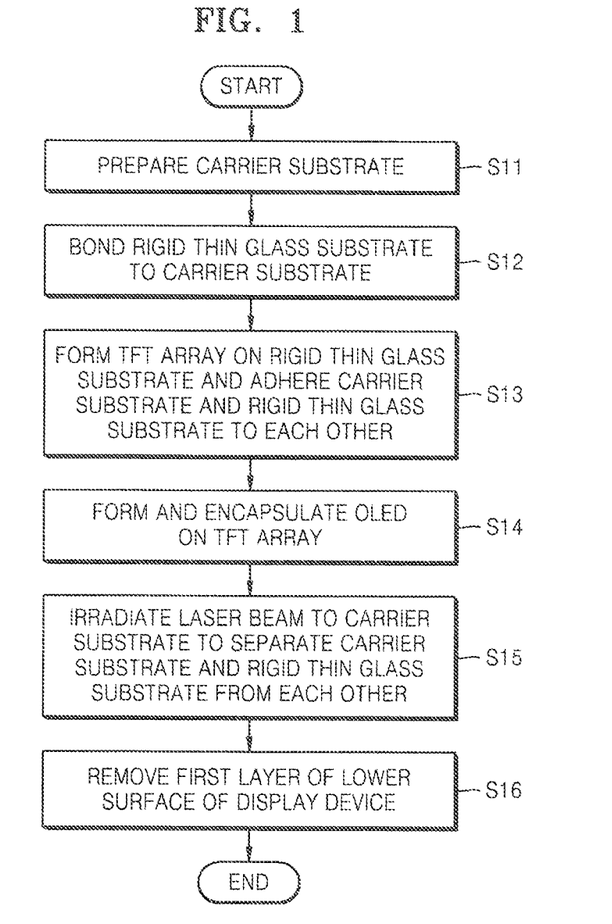
FIG. 1 is a flowchart of a method of manufacturing a display device according to an embodiment of the present invention.
Figure 10:
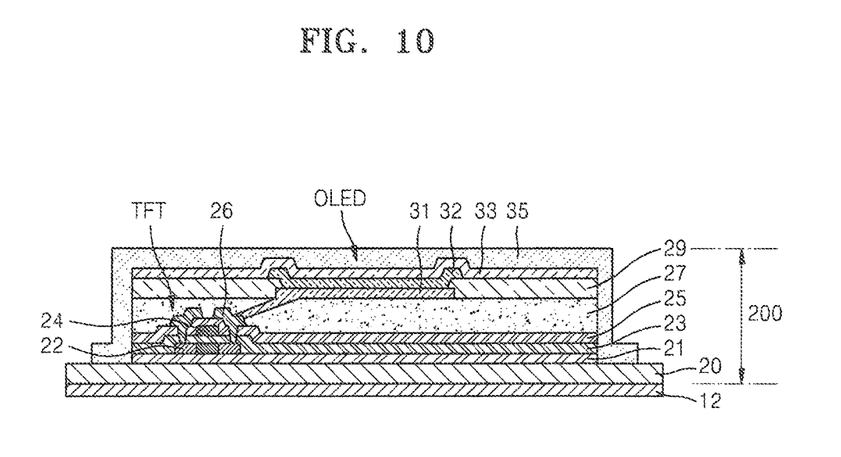
Figure 11:
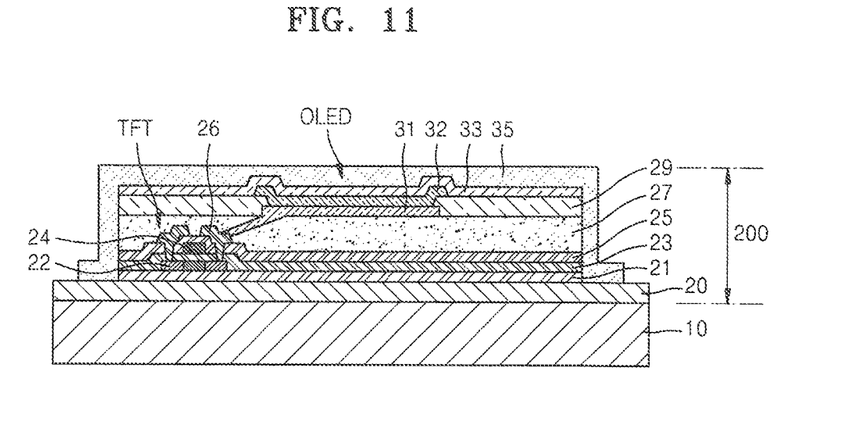
FIG. 11 is a schematic cross-sectional view illustrating a display device constructed according to the related art.

FIG. 1 is a flowchart of a method of manufacturing a display device according to an embodiment of the present invention. FIGS. 2 through 10 are schematic cross-sectional views illustrating the embodiment of the manufacturing method of FIG. 1. FIG. 11 is a schematic cross-sectional view illustrating a display device constructed according to the related art.

As shown in FIG. 1, a method of manufacturing a display device may include a step S11 of preparing a carrier substrate, a step S12 of bonding a rigid thin glass substrate to the carrier substrate, a step S13 of forming a thin film transistor (TFT) array on the rigid thin glass substrate and adhering the carrier substrate and the rigid thin glass substrate to each other, a step S14 of forming and encapsulating an organic light-emitting device (OLED) on the TFT array, a step S15 of irradiating a laser beam to the carrier substrate to separate the carrier substrate and the rigid thin glass substrate from each other, and a step S16 of removing the first layer remained on a lower surface of the display device. The following is a detailed description of the manufacturing method according to an embodiment of the present invention.

First, the manufacturing method may include preparing a carrier substrate 100 (S11).

Figure 4:
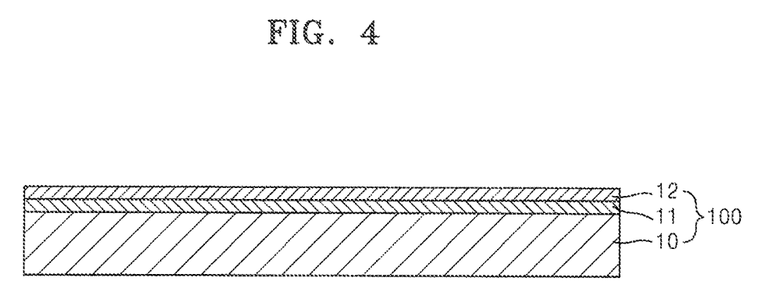

As shown in FIG. 4, the carrier substrate 100 includes a rigid glass substrate 10, a first layer 11 formed on the rigid glass substrate 10, and a second layer 12 formed on the first layer 11.

Figure 2:
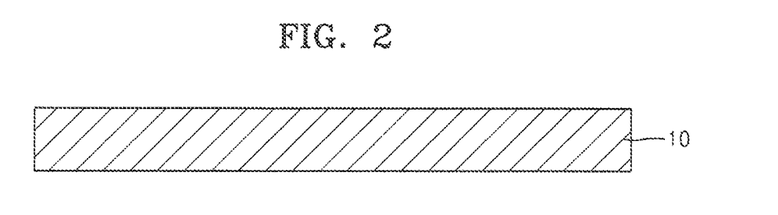
FIGS. 2 through 10 are schematic cross-sectional views illustrating the embodiment of the manufacturing method of FIG. 1.

As shown in FIG. 2, the rigid glass substrate 10 is first prepared. Since a laser beam needs to transmit through the rigid glass substrate 10 during a later detachment process, the rigid glass substrate 10 may be formed of a transparent material. In addition, since the rigid glass substrate 10 needs to support a display device to be formed thereon, the rigid glass substrate 10 may be formed of a rigid material. The rigid glass substrate 10 may be formed of glass using $SiO_2$ as a main constituent. Alternatively, the rigid glass substrate 10 may be formed of at least one of borosilicate glass, fused silica glass, and quartz glass.

Figure 3:
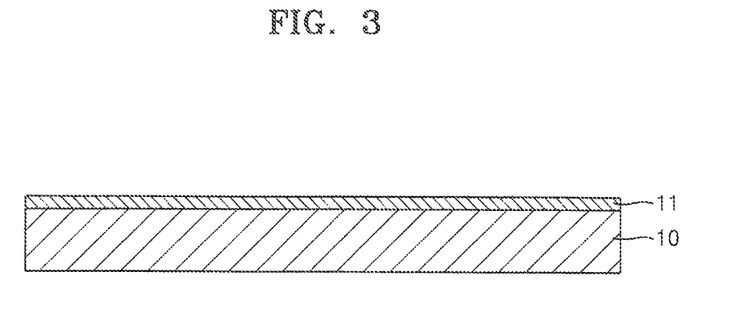

Then, referring to FIG. 3, the first layer 11 is formed on an upper surface of the rigid glass substrate 10. A surface of the first layer 11 is formed of a hydrophobic material. In this case, the surface of the first layer 11 may refer to a surface that contacts the first layer 11 and the rigid glass substrate 10 and a surface that contacts the first layer 11 and the second layer 12 to be formed later. Thus, a covalent bond via a hydroxyl radical (—OH) is not formed between a rigid thin glass substrate 20 (see FIG. 6) which is formed in a later process and the rigid glass substrate 10 even at a high temperature; therefore, the rigid glass substrate 10 may be easily detached from the rigid thin glass substrate 20. In addition, a material constituting the first layer 11 needs to be easily delaminated by irradiating a laser beam. Thus, the rigid glass substrate 10 may be delaminated from the rigid thin glass substrate 20 by a laser beam (a process step shown in FIG. 9 which will be described later). In this case, the delamination of the first layer 11 refers to a phenomenon whereby the first layer 11 absorbs a laser beam of a peculiar wavelength band and energy density and bonds between polymer chains of the first layer 11 are debonded. Thus, the rigid glass substrate 10 and the rigid thin glass substrate 20 formed on opposite surfaces of the first layer 11 are detached from each other.

The first layer 11 may be formed of, but is not limited to, a polymer material such as polyimide (PI). Alternatively, the first layer 11 may be formed of indium tin oxide (ITO). The first layer 11 may have a thickness of about 10 nm to 10 μm. When the thickness of the first layer 11 is less than 10 nm, the rigid glass substrate 10 and the rigid thin glass substrate 20 are partially bonded to each other during high-temperature processes. When the thickness of the first layer 11 is greater than 10 μm, it is difficult to delaminate the first layer 11 by irradiating a laser beam.

FIG. 11 as the related art shows a display device 200 which is manufactured by using only the rigid glass substrate 10 as a carrier substrate. In this case, the rigid thin glass substrate 20 is directly bonded onto the rigid glass substrate 10 via van der Waals force. And then, during a manufacturing process for forming a thin film transistor (TFT) array on the rigid thin glass substrate 20, a process for crystallizing amorphous silicon (a-Si) into polycrystalline silicon (p-Si) includes a high-temperature process performed at about 300° C. to about 500° C. In the high-temperature process, a covalent bond via silicon and oxygen (Si—O) is formed between a surface of the rigid glass substrate 10 as the carrier substrate and a surface of the rigid thin glass substrate 20. Accordingly, the rigid glass substrate 10 and the rigid thin glass substrate 20 are strongly bonded to each other so that the rigid glass substrate 10 and the rigid thin glass substrate 20 may not be easily detached from each other without being damaged. In other words, after the display device 200 is completely manufactured, it is difficult to remove the carrier substrate. Since the manufacturing method of other components of the display device 200 is the same as the manufacturing method which is to be described below, the manufacturing method of other components of the display device 200 will not be repeated here.

Figure 6:
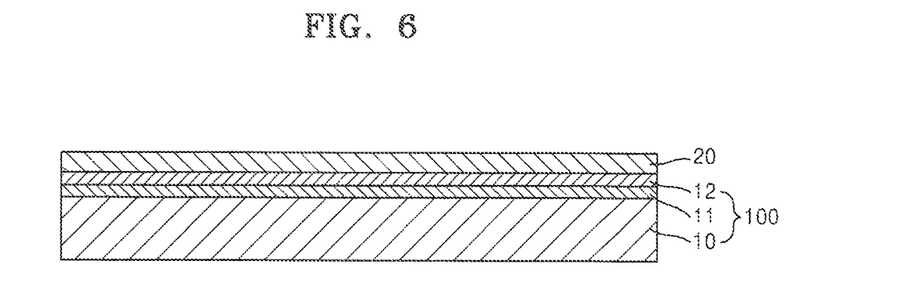

On the other hand, as shown in FIG. 6, the carrier substrate 100 constructed according to an embodiment of the present invention includes the first layer 11 formed on the rigid glass substrate 10 and having a surface formed of a hydrophobic material. Thus, even in a high-temperature process, it is difficult to form a covalent bond between a hydroxyl radical (—OH) of the rigid thin glass substrate 20 and the carrier substrate 100. In addition, because the carrier substrate 100 includes the first layer 11, it is also difficult to bond the carrier substrate 100 and the rigid thin glass substrate 20 to each other.

According to an embodiment of the present invention, the carrier substrate 100 further includes the second layer 12 formed on the first layer 11. The second layer 12 may bond and adhere the carrier substrate 100 and the rigid thin glass substrate 20 to each other such that the carrier substrate 100 may support the display device 200 (see FIG. 8) during the manufacture of the display device 200. The carrier substrate 100, including the first layer 11, is preliminarily bonded to the rigid thin glass substrate 20 via van der Waals force generated due to surface morphology properties and may be cured during the high-temperature process of the manufacture of the display device 200 to further strongly adhere to the rigid thin glass substrate 20. Here, the bonding is a phenomenon whereby two substrates are attached to each other via van der Waals force generated due to surface morphology properties, and the adherence is a phenomenon whereby two substrates are strongly attached to each other via a chemical change using heat compared with the bonding.

The second layer 12 may include at least one of silicon nitride (SiNx) and a transparent metal oxide. Here, the transparent metal oxide may include at least one of amorphous indium zinc oxide (a-IZO), titanium indium zinc oxide (TIZO), and indium gallium zinc oxide (GIZO). These materials have good morphology properties to have low morphology compared with another material, and thus, a distance between the second layer 12 and an attachment surface of the rigid thin glass substrate 20 is maintained as close as possible. Therefore, due to the second layer 12 having the morphology properties, van der Waals force may considerably act between the carrier substrate 100 and the rigid thin glass substrate 20 so as to bond the carrier substrate 100 and the rigid thin glass substrate 20 to each other. Compared with the above-described materials, the morphology properties of polycrystalline indium tin oxide (p-ITO), $H_2O$— indium tin oxide ($H_2O$-ITO), gallium zinc oxide (GZO), aluminum zinc oxide (AZO), and amorphous silicon (a-Si) are less ideal. Table 1 below shows experimental results of bonding forces of the rigid thin glass substrate 20 according to materials of the second layer 12. As described above, a material whether it provides a relatively good bonding force may be determined from experiments.

TABLE 1 symbol "○" represents a stronger bonding force than symbol "Δ", and symbol "Δ" represents a stronger bonding force than "X".

| Material of the second layer 12 | Thickness (Angstroms) | Bonding force of the rigid thin glass substrate 20 |
| --- | --- | --- |
| p-ITO | 500 | Δ |
| $H_2O$-ITO | 500 | Δ |
| a-IZO | 500 | ○ (Bonding like pulling) |
| GZO | 500 | Δ |
| TIZO | 500 | ○ (Bonding like pulling) |
| GIZO | 500 | ○ (Bonding like pulling) |
| a-Si | 500 | Δ |
| SiNx | 500 | ○ (Bonding like pulling) |
| AZO | 500 | X |

The second layer 12 may have a thickness of about 30 nm to 70 nm. When the thickness of the second layer 12 is less than 30 nm, an effect of the presence of the second layer 12 is almost negligible. When the thickness of the second layer 12 is greater than 70 nm, the second layer 12 may not be uniformly cured in a high-temperature process.

According to an embodiment of the present invention, the second layer 12 is further formed on the first layer 11 formed on the rigid glass substrate 10, thereby completing the manufacture of the carrier substrate 100.

Figure 5:
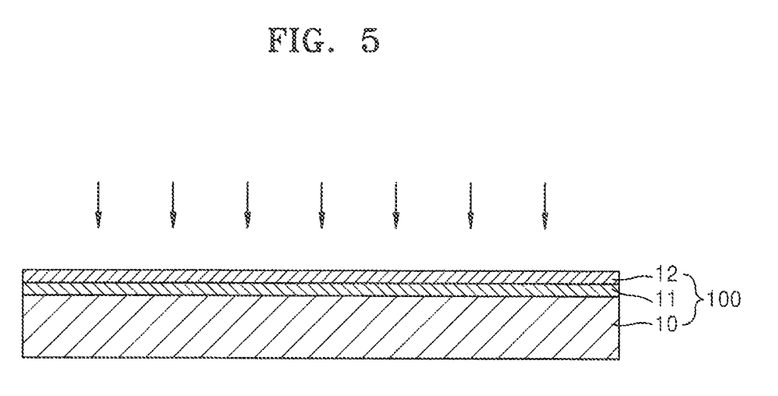

Referring to FIG. 5, a surface of the carrier substrate 100 may be washed before the rigid thin glass substrate 20 (see FIG. 6) is bonded to the carrier substrate 100 of FIG. 4. In detail, the surface of the carrier substrate 100 is washed to remove fine organic materials that remain on a surface of the second layer 12, on which the rigid thin glass substrate 20 (see FIG. 6) is to be bonded. Thus, morphology properties of the carrier substrate 100 may be improved and van der Waals force between the carrier substrate 100 and the rigid thin glass substrate 20 may be increased to strengthen a bonding force. A washing method may include, but is not limited to, a wet washing method using a washing solution. Alternatively, various washing methods, such as a dry washing method using air wind force, may be used.

Referring back to FIG. 6, the rigid thin glass substrate 20 is bonded onto the carrier substrate 100 (S12) after the carrier substrate 100 has been prepared. As described above, the surface of the second layer 12 of the carrier substrate 100 and a lower surface of the rigid thin glass substrate 20 are bonded to each other via van der Waals force. And then, a TFT array and an organic light-emitting device are formed and subsequently encapsulated on the rigid thin glass substrate 20 bonded to the carrier substrate 100, thereby completing the manufacture of the display device 200 (see FIG. 8).

The rigid thin glass substrate 20 may be formed of glass using $SiO_2$ as a main constituent. Alternatively, the rigid thin glass substrate 20 may be formed of at least one of borosilicate glass, fused silica glass, and quartz glass. The rigid thin glass substrate 20 may have a thickness of about 50 μm. Since the rigid thin glass substrate 20 has such a slim thickness, the rigid thin glass substrate 20 may be easily damaged without being supported by the carrier substrate 100 during the manufacture of the display device 200 (see FIG. 8).

Figure 7:
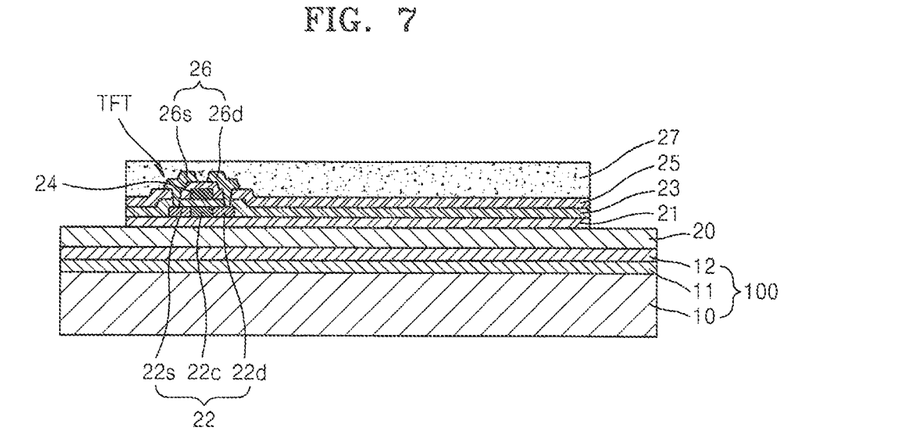

Referring to FIG. 7, a TFT array is formed on the rigid thin glass substrate 20 (S13) following the step in which the rigid thin glass substrate 20 has been bonded onto the carrier substrate 100. FIG. 7 illustrates only a single TFT for convenience of explanation. However, the present invention is not limited thereto. Thus, a plurality of TFTs and storage capacitors may be further included in the display device 200.

A buffer layer 21 may be formed on an upper surface of the rigid thin glass substrate 20 to planarize the upper surface and to prevent impurities from penetrating into the display device 200. The buffer layer 21 may be formed of $SiO_2$ and/or SiNx via various deposition methods, such as plasma-enhanced chemical vapor deposition (PECVD), atmospheric pressure chemical vapor deposition (APCVD), and low pressure chemical vapor deposition (LPCVD).

TFTs are then formed on the buffer layer 21. At least one TFT is formed on each respective pixel and is electrically connected to an organic light-emitting device (OLED of FIG. 8) to drive the OLED. The TFT shown in FIG. 7 is a top gate type TFT including an active layer, a gate electrode, and source/drain electrodes, which are sequentially formed. Although the TFT constructed according to the present embodiment is a top gate type TFT, the present invention is not limited to the aforementioned forms of TFTs, and thus, various types of TFTs may be used.

After that, a semiconductor layer (not shown) is formed on an entire surface of the buffer layer 21. The semiconductor layer may be formed of inorganic semiconductor such as amorphous silicon, organic semiconductor, or the like. Amorphous silicon is crystallized into polycrystalline silicon via various methods. Examples of the crystallizing method may include rapid thermal annealing (RTA), solid phase crystallization (SPC), excimer laser annealing (ELA), metal-induced crystallization (MIC), metal-induced lateral crystallization (MILC), and sequential lateral solidification (SLS). A crystalline silicon layer obtained via the aforementioned process is patterned and then a source region and a drain region, which are formed on edge regions, are doped with impurities to form an active layer 22 including a source region 22s, a drain region 22d, and a channel region 22c therebetween as shown in FIG. 7.

A process for forming the semiconductor layer into the active layer 22 includes a high-temperature process at about 300° C. to about 500° C. For example, with regard to ELA, the amount of hydrogen of amorphous silicon needs to be less than about 10%. Hydrogen is formed during irradiation of a laser beam for crystallization. When the amount of hydrogen of amorphous silicon is high, the properties of polycrystalline silicon may deteriorate, and thus, a TFT having excellent properties may not be manufactured. Therefore, the amount of hydrogen of amorphous silicon is reduced via the high-temperature process performed at about 300° C. to about 500° C. For another example, in order to form the active layer 22 by doping polycrystalline silicon with impurities and activating the active layer 22, a high activation temperature of about 400° C. is required.

While the high-temperature processes for forming the TFT array are performed, the second layer 12 of the carrier substrate 100 may be cured such that the rigid thin glass substrate 20 and the carrier substrate 100 may be strongly adhered to each other (S13). However, since the first layer 11 formed between the rigid thin glass substrate 20 and the carrier substrate 100 may be delaminated by irradiating a laser beam, the rigid thin glass substrate 20 and the carrier substrate 100 may be detachable from each other in a later process.

A gate insulating layer 23 formed of $SiO_2$, SiNx, or the like is formed on the active layer 22, and a gate electrode 24 is formed on a predetermined region of the gate insulating layer 23. The gate electrode 24 is connected to a gate line (not shown) for applying an on/off signal of a TFT.

Referring still to FIG. 7, an interlayer insulating layer 25 is formed on the gate electrode 24. A source electrode 26s and a drain electrode 26d of source/drain electrode 26 are formed to respectively contact the source region 22s and the drain region 22d of the active layer 22 through a contact hole.

The TFT formed via this process is then covered and protected by a passivation layer 27. The passivation layer 27 may be formed as an inorganic insulating layer and/or an organic insulating layer. The inorganic insulating layer may include $SiO_2$, SiNx, SiON, $Al_2O_3$, $TiO_2$, $Ta_2O_5$, $HfO_2$, $ZrO_2$, BST, or PZT, and the organic insulating layer may include polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinyl alcohol-based polymer, or a combination thereof. The passivation layer 27 may be formed as a multi-stack including the inorganic insulating layer and the organic insulating layer.

An OLED is then formed on the passivation layer 27 (S14).

Figure 8:
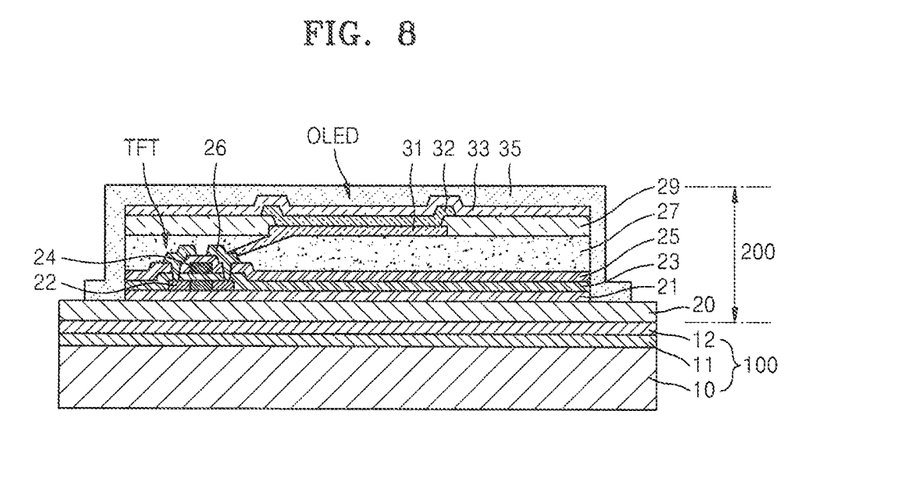

The OLED includes a pixel electrode 31 formed on the passivation layer 27, an opposite electrode 33 facing the pixel electrode 31, and an intermediate layer 32 interposed therebetween. The display device 200 is classified into a bottom emission type display device, a top emission type display device, a dual emission type display device, and the like. The bottom emission type display device includes a light transmitting electrode as the pixel electrode 31 and a reflective electrode as the opposite electrode 33. The top emission type display includes a reflective electrode as the pixel electrode 31 and a semi-transmitting electrode as the opposite electrode 33. According to an embodiment of the present invention, the display device 200 is a bottom emission type display device. However, embodiments of the present invention are not limited to this.

The pixel electrode 31 is formed as a transparent layer formed of ITO, IZO, ZnO, or In2O3 having a high work function. The pixel electrode 31 may be patterned to have an island form that corresponds to each pixel. In addition, the pixel electrode 31 may be connected to an external terminal (not shown) and thus may function as an anode electrode.

A pixel-defining layer (PDL) 29 that is an insulating layer is formed on the pixel electrode 31 so as to cover the pixel electrode 31. After a predetermined opening is formed in the PDL 29, the intermediate layer 32 is formed in a region defined by the opening.

The opposite electrode 33 may be formed as the reflective electrode by using Li, Ca, LiF/Ca, LiF/Al, Al, Mg, Ag, or the like having a low work function. The opposite electrode 33 may be formed on an entire emission region in which an image is realized. Also, the opposite electrode 33 may be connected to an external terminal (not shown) and thus may function as a cathode electrode.

Polarities of the pixel electrode 31 and the opposite electrode 33 may be switched.

The intermediate layer 32 includes an organic light-emitting layer that is formed of a small molecule organic material or a polymer organic material. When the organic light-emitting layer is a small molecule organic layer formed of a small molecule organic material, a hole transport layer (HTL) and a hole injection layer (HIL) may be stacked below the organic light-emitting layer toward the pixel electrode 31, and an electron transport layer (ETL) and an electron injection layer (EIL) may be stacked on the organic light-emitting layer toward the opposite electrode 33. In addition to these layers, various layers including an HIL, an HTL, an ETL, an EIL or the like may be stacked on or below the organic light-emitting layer according to necessity.

When the organic light-emitting layer is a polymer organic layer formed of a polymer organic material, only a polymer HTL may be stacked on the organic light-emitting layer toward the pixel electrode 31. The polymer HTL is formed of poly(3,4-ethylenedioxythiophene) (PEDOT) or polyaniline (PAM) and formed on the pixel electrode 31 by using an inkjet printing method or a spin coating method.

Then, referring to FIG. 8, a display portion is encapsulated so as to be protected from external moisture or air (S14). As shown in FIG. 8, the encapsulation may be obtained by forming a thin encapsulation film 35 on the display portion so as to protect the display portion. The encapsulation film 35 may have, but is not limited to, a structure in which a layer including an inorganic material, such as silicon oxide or silicon nitride, and a layer including an organic material, such as epoxy or polyimide, are alternately stacked. However, the present invention is not limited to the case shown in FIG. 8. Thus, the display portion may be encapsulated by using an encapsulation substrate. The encapsulation substrate may be a glass substrate, a plastic substrate, or a stainless using steel (SUS) substrate. The rigid thin glass substrate 20 and the encapsulation substrate may be adhered to each other by a sealing member formed along edge portions of the rigid thin glass substrate 20 and the encapsulation substrate.

Figure 9:
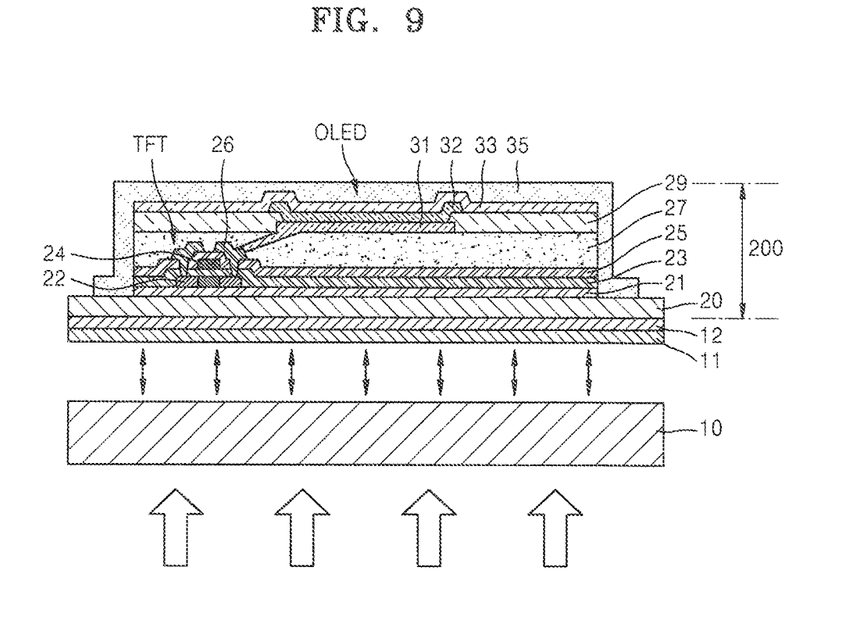

Then, referring to FIG. 9, a laser beam is used to separate the carrier substrate 100 and the rigid thin glass substrate 20 from each other (S15). In detail, a laser beam of a peculiar wavelength band and energy density irradiates onto the first layer 11 of the carrier substrate 100, which is formed of polyimide, and subsequently, polyimide polymer absorbs the laser beam of the peculiar wavelength band and energy density such that bonds between polymer chains are debonded to delaminate the first layer 11.

The wavelength band of the irradiated layer beam is about 250 nm to 350 nm and the energy density is about 250 mJ/cm$^2$ to 350 mJ/cm$^2$. When the wavelength band is less than 250 nm and greater than 350 nm, bonds between polymer chains included in the first layer 11 are not debonded, and thus, the first layer 11 is not delaminated. When the energy density is less than 250 mJ/cm$^2$, bonds between polymer chains included in the first layer 11 are not debonded, and the first layer 11 is not delaminated. When the energy density is greater than 350 mJ/cm$^2$, other members may be damaged.

The second layer 12 remains on the lower surface of the rigid thin glass substrate 20 of the display device 200 (see FIG. 9) from which the rigid glass substrate 10 of the carrier substrate 100 is detached. The second layer 12 functions as a protective layer of the lower surface of the display device 200 (see FIG. 9). Therefore, in subsequent processes, a separate protective film does not have to be attached to the second layer 12.

A portion of the first layer 11 other than the second layer 12 may remain on the lower surface of the display device 200 (see FIG. 9). Referring to FIG. 10, the remaining portion of the first layer 11 is removed. The remaining portion of the first layer 11 may be removed by using an etchant or may be washed off by using an organic solvent (S16).

The carrier substrate 100, including the first layer 11 and the second layer 12, may be easily bonded and adhered to the rigid thin glass substrate 20 during the manufacture of the display device 200 (see FIG. 8) by using the rigid thin glass substrate 20. Thus, during the manufacture of the display device 200, the carrier substrate 100 may support the rigid thin glass substrate 20 and may prevent damage to the rigid thin glass substrate 20 and may be easily detached from the display device 200, thereby preventing failure of the display device 200 (see FIG. 8) from occurring. The second layer 12 remains on the lower surface of the display device 200 (see FIG. 8) and functions as a protective layer. Thus, a process for forming a separate protective film may be omitted.

According to the embodiment of FIG. 7, an organic light-emitting device is formed on a passivation layer. However, aspects of the present invention are not limited thereto, and the one or more embodiments of the present invention may also be applied to an example in which the organic light-emitting device is formed on the gate insulating layer 23 or an interlayer insulating layer via reduction of a lithography process.

According to the one or more embodiments of the present invention, after a display device is manufactured by using a rigid thin glass substrate bonded to a carrier glass substrate, the rigid thin glass substrate may be easily detached without being damaged.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a display device, the method comprising:
   forming a first layer on a first rigid glass substrate, the first layer having a hydrophobic surface;
   forming a second layer on the first layer to prepare a carrier substrate, the carrier substrate including the first rigid glass substrate, the first layer, and the second layer;
   bonding a second rigid thin glass substrate onto the second layer;
   forming and encapsulating a display portion on an upper surface of the second rigid thin glass substrate, the second rigid thin glass substrate positioned between the display portion and the second layer; and
   irradiating a laser beam to delaminate the first layer and detaching the second rigid thin glass substrate from the first rigid glass substrate.

2. The method of claim 1, wherein the forming and encapsulating of the display portion comprises:
   forming a thin film transistor (TFT) array on the upper surface of the second rigid thin glass substrate, the second layer being cured such that the second rigid thin glass substrate and the carrier substrate are adhered to each other; and
   forming and encapsulating an organic light-emitting device on the TFT array.

3. The method of claim 1, wherein the second layer and the first layer remain on a lower surface of the second rigid thin glass substrate after the detaching the second rigid thin glass substrate from the first rigid glass substrate, and wherein the method further comprises removing a remaining portion of the first layer.

4. The method of claim 1, wherein the laser beam uses a wavelength band of 250 nm to 350 nm and an energy density of 250 mJ/cm$^2$ to 350 mJ/cm$^2$.

5. The method of claim 1, further comprising, prior to the bonding, washing an outside surface of the second layer.

6. The method of claim 1, wherein the first layer comprises polyimide.

7. The method of claim 1, wherein the first layer has a thickness of 10 nm to 10 μm.

8. The method of claim 1, wherein the second layer comprises at least one of silicon nitride (SiNx) and a transparent metal oxide.

9. The method of claim 8, wherein the transparent metal oxide comprises at least one of amorphous indium zinc oxide (a-IZO), titanium indium zinc oxide (TIZO), and indium gallium zinc oxide (GIZO).

10. The method of claim 1, wherein the second layer has a thickness of 30 nm to 70 nm.

11. A carrier substrate, comprising:
    a first rigid substrate formed of glass;
    a second layer comprising at least one of silicon nitride (SiNx) and a transparent metal oxide, being directly bonded with a second glass substrate; and
    a first layer interposed between the first rigid substrate and the second layer, the first layer having a hydrophobic surface and being capable of being delaminated by irradiating a laser beam.

12. The carrier substrate of claim 11, wherein the first layer comprises polyimide.

13. The carrier substrate of claim 11, wherein the first layer has a thickness of 10 nm to 10 μm.

14. The carrier substrate of claim 11, wherein the transparent metal oxide comprises at least one of amorphous indium zinc oxide (a-IZO), titanium indium zinc oxide (TIZO), and indium gallium zinc oxide (GIZO).

15. The carrier substrate of claim 11, wherein the second layer has a thickness of 30 nm to 70 nm.

* * * * *